United States Patent
Ikeguchi

(10) Patent No.: US 7,092,042 B2
(45) Date of Patent: Aug. 15, 2006

(54) BROADCASTING RECEIVER

(75) Inventor: Yasuyuki Ikeguchi, Hyogo (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 572 days.

(21) Appl. No.: 10/443,062

(22) Filed: May 22, 2003

(65) Prior Publication Data

US 2003/0218693 A1    Nov. 27, 2003

(30) Foreign Application Priority Data

May 24, 2002    (JP)    ............................... 2002/150440

(51) Int. Cl.
*H04N 3/27*    (2006.01)
(52) U.S. Cl. ...................... 348/725; 348/505; 348/509; 348/730; 348/706
(58) Field of Classification Search ........ 348/725–728, 348/553–558, 705–706, 505, 549; H04N 3/27
See application file for complete search history.

(56) References Cited

U.S. PATENT DOCUMENTS

| | | | | |
|---|---|---|---|---|
| 5,331,347 A * | 7/1994 | Wu | .............................. | 348/536 |
| 5,793,437 A * | 8/1998 | Inamori | ....................... | 348/559 |
| 5,864,373 A * | 1/1999 | Hatano | ......................... | 348/737 |
| 5,881,114 A * | 3/1999 | Moon | .......................... | 375/376 |
| 5,956,098 A * | 9/1999 | Mizukami et al. | ........... | 348/735 |
| 5,963,608 A * | 10/1999 | Casper et al. | ................ | 375/373 |
| 6,421,098 B1 * | 7/2002 | Oya | ............................ | 348/678 |
| 6,483,553 B1 * | 11/2002 | Jung | ........................... | 348/731 |
| 6,636,222 B1 * | 10/2003 | Valmiki et al. | .............. | 345/505 |
| 6,995,806 B1 * | 2/2006 | Al-Araji et al. | ............. | 348/725 |

* cited by examiner

*Primary Examiner*—Brian P. Yenke
(74) *Attorney, Agent, or Firm*—Westerman, Hattori, Daniels & Adrian, LLP.

(57) ABSTRACT

A PLL circuit compares a PCR with the output frequency of a voltage controlled oscillator (VCO), and returns a voltage value which is the result of the comparison to the VCO, so that a reference clock corresponding to the PCR is outputted from the VCO. A switch supplies a control voltage from the PLL circuit to the VCO when digital broadcasting is viewed, while feeding a fixed voltage from a fixed voltage power supply to the VCO when analog broadcasting is viewed, to stably output a clock having a frequency of 27 MHz irrespective of the change in the PCR.

4 Claims, 2 Drawing Sheets

BROADCASTING RECEIVER

BACKGROUND OF THE INVENTION

Field of the Invention

The present invention relates to a broadcasting receiver capable of receiving both digital broadcasting and analog broadcasting.

A broadcasting receiver that receives a terrestrial digital broadcasting wave selects any one of a plurality of broadcasting waves received through a terrestrial wave antenna by a digital tuner, selects any one of a plurality of channels included in the selected broadcasting wave by demultiplex processing, extracts a digital signal on the selected channel, and decodes the extracted digital signal, to output a video/audio signal. It is possible to configure a digital-analog broadcasting receiver comprising such a digital tuner for receiving digital television broadcasting as well as a conventional analog tuner for receiving analog broadcasting.

The broadcasting receiver that receives both digital broadcasting and analog broadcasting comprises a digital tuner 2, a digital demodulator 3, an error correcting circuit (FEC) 4, a demultiplexer (a TS decoder and a PLL (Phase-Locked Loop) circuit) 5, an audio decoder 6, a video decoder 7, and so on in a digital broadcasting video generator 31, and comprises an analog tuner 16, an analog demodulator 17, an analog-to-digital (A/D) conversion circuit (ADC) 18, and so on in an analog broadcasting video generator 32, as shown in FIG. 2.

A video signal outputted via the video decoder 7 and a format conversion circuit 9 is a luminance signal and a color difference signal (a component signal: Y, Cb, Cr), and a video cannot be displayed by television set (not shown) comprising no component signal input terminal. In the above-mentioned broadcasting receiver, therefore, a video encoder 14 converts the component signal into a composite signal (an NTSC (National Television System Committee) signal, a PAL (Phase Alternation by Line) signal, etc.). The television connected to the above-mentioned broadcasting receiver inputs an output of the video encoder 14 from a video terminal, to display a video.

In a digital television broadcasting system, an MPEG2 (Moving Picture Expert Group2) system has been employed. In the MPEG2 system, a program clock reference value (PCR: Program Clock Reference) which is the present time presumed by a transmitting apparatus (on the side of a broadcasting station) and the time when a video/audio should be presented (PTS: Presentation Time Stamp) are sent in order to decode MPEG2 data and synchronize a video and an audio. A PCR field is stored in a region composed of 42 bits in an optional field of a transport stream, and comprises a PCR base region composed of 33 bits and a PCR extension region composed of 9 bits. Data in the PCR base region is increased one by one in units of 90 kHz, and data in the PCR extension region is increased one by one in units of 27 MHz. The PCR value is counted up from zero to 299 in units of 27 MHz in the PCR extension region, and the data in the PCR base region is increased by one at the same time that the data in the PCR extension region reaches zero. The PCR is sent once within at least 100 ms, and the PTS is sent once per 700 ms. The demultiplexer 5 separates the PCR from the transport stream, to generate a reference clock (27 MHz) required to decode an audio and a video. Specifically, a PLL circuit 5b compares the PCR with the output frequency of a voltage controlled oscillator (VCO) 11, and returns a voltage value which is the result of the comparison to the voltage controlled oscillator 11, so that a reference clock corresponding to the PCR is outputted from the voltage controlled oscillator 11.

An OSD (On-Screen Display) circuit 13 performs processing for incorporating video data based on character information and color information which it is instructed to output from a CPU (not shown) into received video data. The OSD circuit 13 performs digital processing, and is also used for an analog broadcasting video. Therefore, the analog broadcasting video is changed into video data via the A/D conversion circuit 18, is selected by a video switch 12, and is supplied to the video encoder 14 via the OSD circuit 13.

Meanwhile, the reference clock (27 MHz) outputted from the voltage controlled oscillator 11 is also used as a reference clock in a case where the video encoder 14 generates a composite signal (an NTSC signal or a PAL signal). For example, in the NTSC composite signal, a color sub-carrier (3.579545 MHz) is incorporated as a burst signal into a back porch of a horizontal synchronizing signal. Therefore, the video encoder 14 generates a color sub-carrier (3.579545 MHz) signal by the PLL circuit 5b or the like on the basis of the reference clock (27 MHz).

Here, in a color signal reproduction circuit in a television connected to the broadcasting receiver, the color sub-carrier signal is extracted, to reproduce a clock having a predetermined phase difference therefrom. A voltage controlled oscillator using a crystal oscillator is generally used for the reproduction of the clock. Further, a crystal oscillator is also used for the voltage controlled oscillator 11 in the broadcasting receiver. Accordingly, the respective variable frequency ranges are at approximately the same ratio to the oscillation frequency. When the oscillation frequency of the voltage controlled oscillator 11 oscillates to a maximum or a minimum, the oscillation frequency of the color signal reproduction circuit on the side of the television cannot follow the oscillation. Accordingly, the color signal cannot be reproduced so that a video may be monochrome. That is, when a stream including a PCR greatly deviating from its standard value is inputted to the demultiplexer (TS decoder) 5 in the broadcasting receiver, the PLL circuit 5b acts in order to follow the frequency in the PCR such that the frequency of the voltage controlled oscillator 11 greatly deviates from its central value. Therefore, the color sub-carrier signal in the composite video signal outputted from the video encoder 14 exceeds a range which can be followed by the color reproduction circuit in the television, so that the video becomes monochrome.

Even in a state where an analog broadcasting received video is outputted, the digital tuner 2, the demultiplexer 5, the voltage controlled oscillator 11, and so on are in operation in order to realize the quick representation of a digital broadcasting video at the time of switching the receiving of digital broadcasting. The clock outputted by the voltage controlled oscillator 11 is supplied to the video encoder 14 even in a state where the analog broadcasting received video is outputted. Even in processing of the analog broadcasting received video in the video encoder 14, therefore, when the clock frequency of the voltage controlled oscillator 11 greatly deviates from the central value, the color sub-carrier signal in the composite video signal generated after the analog broadcasting received video is changed into video data exceeds a range which can be followed by the color reproduction circuit in the television so that the video becomes monochrome, as described above.

SUMMARY OF THE INVENTION

In view of the foregoing circumstances, an object of the present invention is to provide a broadcasting receiver capable of making a color sub-carrier signal in a composite video signal generated after an analog broadcasting received video is changed into video data fall within a defined value even if a stream including a program clock reference value greatly deviating from its reference value is inputted.

In order to solve the above-mentioned problem, in a broadcasting receiver comprising a digital broadcasting video generator, receiving a stream including video data and a program clock reference value, for supplying a clock generated by a voltage controlled oscillator on the basis of the program clock reference value to a decoder for decoding the video data, and also supplying the clock to a video encoder for generating a composite signal on the basis of the decoded data, and an analog broadcasting video generator for changing a video signal demodulated from an analog broadcasting wave into digital data and supplying the digital data to the video encoder, a broadcasting receiver according to the present invention is characterized by comprising a fixed voltage power supply for generating a fixed voltage having a predetermined voltage value; and a switch for supplying the fixed voltage to the voltage controlled oscillator at the time of viewing analog broadcasting.

In the above-mentioned configuration, even if the stream including the program clock reference value greatly deviating from its standard value is inputted, the fixed voltage is supplied to the voltage controlled oscillator when analog broadcasting is viewed. Accordingly, the color sub-carrier signal in the composite video signal generated after the analog broadcasting received video is changed into the video data can fall within the defined value, thereby making it possible to prevent the color of the video from disappearing on the side of the television that receives the composite video signal.

The broadcasting receiver may be so configured that either one of video data based on digital broadcasting and video data based on analog broadcasting is selected by a selection switch, and is supplied to the video encoder through an on-screen display circuit.

Furthermore, the broadcasting receiver may be so configured that the fixed voltage power supply is set such that the voltage controlled oscillator creates a voltage value for generating a clock having a frequency of 27 MHz.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
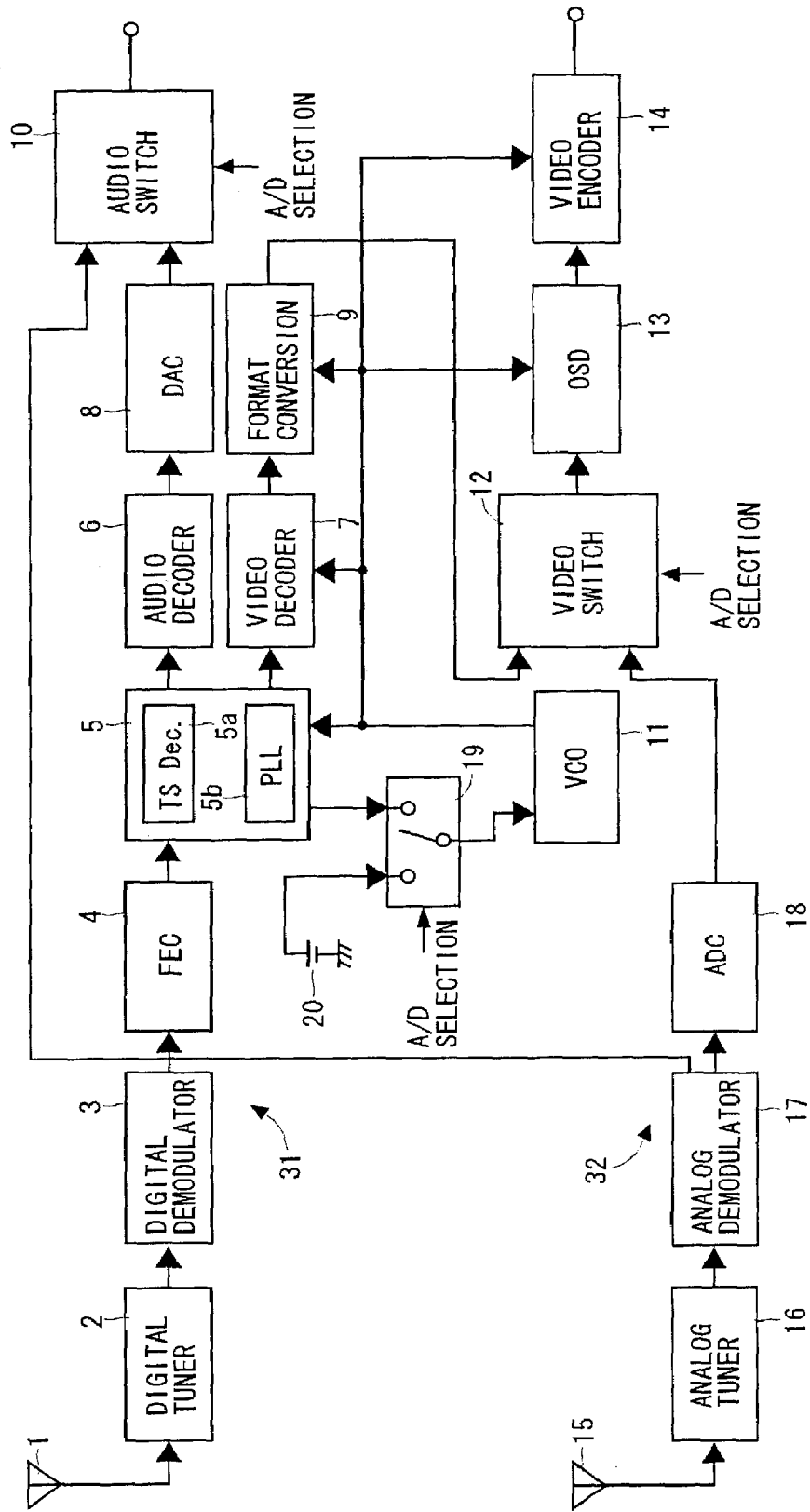
FIG. 1 is a block diagram showing a broadcasting receiver according to the present embodiment.
Figure 2:
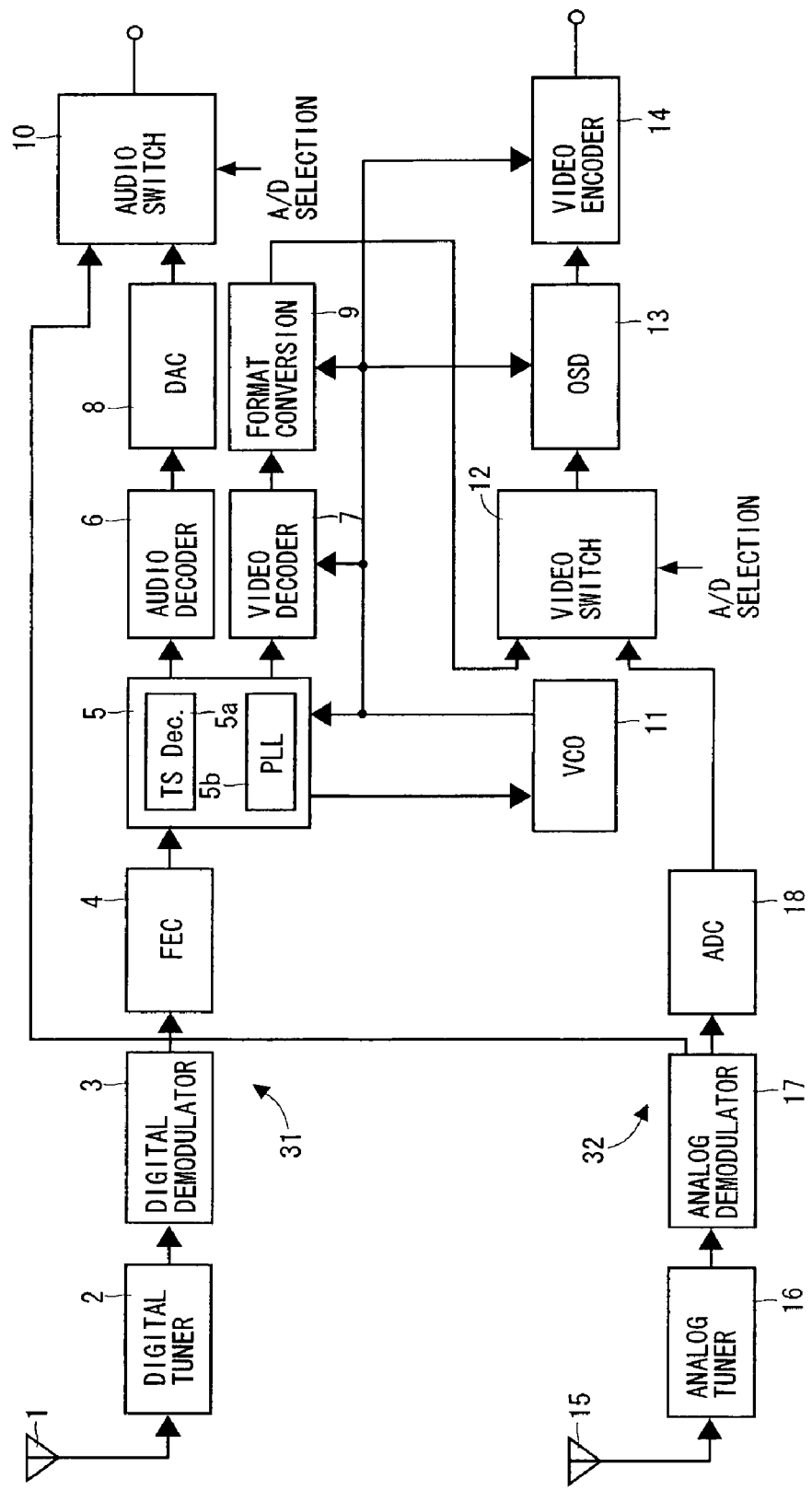
FIG. 2 is a block diagram showing a conventional broadcasting receiver.

An embodiment of the present invention will be described on the basis of FIG. 1. A case where a user receives both terrestrial wave digital broadcasting and terrestrial wave analog broadcasting is illustrated herein. FIG. 1 is a block diagram showing a broadcasting receiver according to the present embodiment. For convenience of illustration, the same constituent elements as those in the conventional broadcasting receiver shown in FIG. 2 are assigned the same reference numerals.

Antennas 1 and 15 respectively receive a digital broadcasting signal and an analog broadcasting signal which are sent from a terrestrial wave broadcasting station. The antennas 1 and 15 are not separately provided but are integrated and shared between the digital broadcasting signal and the analog broadcasting signal.

A digital tuner 2 extracts, out of high-frequency digital modulation signals including video/audio data, the digital modulation signal having a particular frequency. A digital demodulator 3 demodulates the selected digital modulation signal, to output a transport stream (TS). An error correcting circuit (FEC) 4 detects and corrects an error in digital data.

A demultiplexer (a TS decoder (TS Dec.) 5*a*) 5 separates the outputted transport stream into a video stream and an audio stream based on MPEG2 (Moving Picture Expert Group2), PSI/SI (Program Specific Information/Service Information), a program clock reference value (PCR: Program Clock Reference), and so on. A PLL circuit 5*b* in the demultiplexer 5 compares the above-mentioned PCR with the output frequency of a voltage controlled oscillator (VCO) 11, and returns a control voltage value which is the result of the comparison to the voltage controlled oscillator 11 through a switch 19. A reference clock corresponding to the PCR is outputted from the voltage controlled oscillator 11 by the returned control voltage value.

The audio stream obtained by the demultiplexer 5 is supplied to an audio decoder 6. The audio decoder 6 decodes an inputted coded signal to generate audio data. The audio data is converted into an analog audio signal by a digital-to-analog converter (DAC) 8. The video stream obtained by the demultiplexer 5 is supplied to a video decoder 7. The video decoder 7 decodes an inputted variable length code, to find a quantization factor and a motion vector, and outputs a luminance signal and a color difference signal (a component signal: Y, Cb, Cr) after carrying out inverse DCT conversion and motion compensation control based on the motion vector, for example. Digital broadcasting conforms to such a specification that a video having a higher resolution (480*p*, 1080*i*) than that of a standard television can be transmitted. A format conversion circuit 9 converts the video having a high resolution (480*p*, 1080*i*) into a standard video (480*i*) such that a video can be displayed even in a standard television.

An analog tuner 16 extracts, out of analog broadcasting signals, the analog broadcasting signal having a particular frequency. An analog demodulator 17 demodulates the selected analog broadcasting signal, to output a video signal and an audio signal. The video signal is converted into digital video data (480*i*) by an analog-to-digital conversion circuit (ADC) 18.

An audio switch 10 selects the audio signal from the analog demodulator 17 and outputs the selected audio signal when analog broadcasting is viewed, while selecting the audio signal from the digital-to-analog converter (DAC) 8 and outputting the selected audio signal when digital broadcasting is viewed. A video switch 12 selects the video data from the analog-to-digital conversion circuit 18 and outputs the selected video data when analog broadcasting is viewed, while selecting video data from the format conversion circuit 9 and outputting the selected video data when digital broadcasting is viewed.

An OSD (On-Screen Display) circuit 13 performs processing for incorporating into the received video data video data based on character information and color information which it is instructed to output from a CPU (not shown). The OSD circuit 13 performs digital processing, and shall be also used for an analog broadcasting video.

A video encoder 14 receives the video data which has passed through the OSD circuit 13, and converts the video data into an NTSC composite signal using the clock supplied from the voltage controlled oscillator 11. In the NTSC system, the frequency of the color sub-carrier signal is 3.579545 MHz. The video encoder 14 uses the clock supplied from the voltage controlled oscillator 11, to generate the above-mentioned color sub-carrier signal.

The switch 19 receives a voltage supplied from a fixed voltage power supply 20 for generating a fixed voltage having a predetermined voltage value and the control voltage from the PLL circuit 5b, and selects the fixed voltage and supplies the selected fixed voltage to the voltage control oscillator 11 when analog broadcasting is viewed, while selecting the control voltage from the PLL circuit 5b and supplying the selected control voltage to the voltage controlled oscillator 11 when digital broadcasting is viewed. A signal indicating which of analog broadcasting and digital broadcasting should be viewed (an A/D selection signal) is outputted from the CPU, for example. The switch 19 has a PNP transistor, an NPN transistor, or the like, and uses a circuit structure for inputting a High/Low Analog/Digital selection signal, for example, into the base of the transistor, for example, to select a signal. The fixed voltage power supply 20 is set such that the voltage controlled oscillator 11 creates a voltage value for generating a clock having a frequency of 27 MHz which is a central value of its oscillation frequency.

Also in a state where analog broadcasting is viewed, the digital tuner 2, the demultiplexer 5, the voltage controlled oscillator 11, and so on are in operation, to input a stream including a program clock reference value in order to realize the quick presentation of a digital broadcasting video at the time of switching the receiving of digital broadcasting. The clock outputted by the voltage controlled oscillator 11 is also supplied to the video encoder 14 even in a case where analog broadcasting is viewed. When analog broadcasting is viewed, not the control voltage from the PLL circuit 5a but the voltage supplied from the fixed voltage power supply 20 is selected by the switch 19, and is supplied to the voltage controlled oscillator 11. Even if the stream including the program clock reference value greatly deviating from its standard value is inputted when analog broadcasting is viewed, a fixed voltage is supplied to the voltage controlled oscillator 11. Accordingly, the color sub-carrier signal in the composite video signal generated after the analog broadcasting received video is changed into video data can fall within a defined value, thereby making it possible to prevent the color of the video from disappearing on the side of a receiver that receives the composite video signal.

As described in the foregoing, according to the present invention, even if the stream including the program clock reference value (PCR) greatly deviating from its standard value is inputted, the composite video signal having the stable color sub-carrier signal can be outputted when analog broadcasting is viewed, thereby making stable color reproduction on the side of the receiver possible.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a broadcasting receiver comprising a digital broadcasting video generator, receiving a stream including video data and a program clock reference value, for supplying a clock generated by a voltage controlled oscillator on the basis of said program clock reference value to a decoder for decoding the video data, and also supplying the clock to a video encoder for generating a composite signal on the basis of the decoded data, and an analog broadcasting video generator for changing a video signal demodulated from an analog broadcasting wave into digital data and supplying the digital data to said video encoder, a broadcasting receiver comprising:

a fixed voltage power supply for generating a fixed voltage having a predetermined voltage value; and a switch for supplying said fixed voltage to said voltage controlled oscillator during the entire time of viewing analog broadcasting.

2. The broadcasting receiver according to claim 1, wherein either one of video data based on digital broadcasting and video data based on analog broadcasting is selected by a selection switch, and is supplied to said video encoder through an on-screen display circuit.

3. The broadcasting receiver according to claim 1, wherein said fixed voltage power supply is set such that said voltage controlled oscillator creates a voltage value for generating a clock having a frequency of 27 MHz.

4. The broadcasting receiver according to claim 2, wherein said fixed voltage power supply is set such that said voltage controlled oscillator creates a voltage value for generating a clock having a frequency of 27 MHz.

* * * * *